(12) United States Patent
Machida et al.

(10) Patent No.: US 7,384,690 B2
(45) Date of Patent: Jun. 10, 2008

(54) BIAXIALLY ORIENTED THERMOPLASTIC RESIN FILM

(75) Inventors: Tetsuya Machida, Otsu (JP);
Shigetoshi Maekawa, Takatsuki (JP);
Takuji Higashioji, Kyoto (JP); Tetsuya Tsunekawa, Otsu (JP)

(73) Assignee: Toray Industries, Inc. (JP)

( * ) Notice: Subject to any disclaimer, the term of this patent is extended or adjusted under 35 U.S.C. 154(b) by 297 days.

(21) Appl. No.: 10/501,041

(22) PCT Filed: Jan. 8, 2003

(86) PCT No.: PCT/JP03/00076

§ 371 (c)(1),
(2), (4) Date: Jul. 8, 2004

(87) PCT Pub. No.: WO03/059995

PCT Pub. Date: Jul. 24, 2003

(65) Prior Publication Data

US 2005/0020803 A1    Jan. 27, 2005

(30) Foreign Application Priority Data

Jan. 10, 2002  (JP) .............................. 2002-003502
Jan. 10, 2002  (JP) .............................. 2002-003503

(51) Int. Cl.
*B32B 27/18*     (2006.01)
*B32B 27/20*     (2006.01)
*B32B 27/36*     (2006.01)
*B32B 27/32*     (2006.01)
*B32B 27/34*     (2006.01)

(52) U.S. Cl. ............ 428/328; 428/323; 428/329; 428/338; 428/412; 428/474.7; 428/473.5; 428/480; 428/500; 428/910; 528/308; 528/308.6; 525/437

(58) Field of Classification Search ............ None
See application file for complete search history.

(56) References Cited

U.S. PATENT DOCUMENTS

| | | | | |
|---|---|---|---|---|
| 3,683,060 | A | * | 8/1972 | Tanabe et al. ......... 264/235.8 |
| 4,421,887 | A | * | 12/1983 | Horie et al. ............ 524/317 |
| 4,426,479 | A | | 1/1984 | Deguchi et al. |
| 4,619,869 | A | | 10/1986 | Kiriyama et al. |
| 5,242,757 | A | * | 9/1993 | Buisine et al. ........... 428/480 |
| 5,434,000 | A | * | 7/1995 | Konagaya et al. ....... 428/329 |
| 5,723,208 | A | * | 3/1998 | Suzuki et al. ........... 428/216 |
| 6,124,043 | A | * | 9/2000 | Tsukamoto et al. ...... 428/480 |
| 6,139,952 | A | * | 10/2000 | Furuya et al. ........... 428/339 |
| 6,261,663 | B1 | * | 7/2001 | Peiffer et al. ........... 428/141 |
| 6,355,345 | B1 | * | 3/2002 | Furuya et al. ........... 428/343 |
| 6,420,011 | B1 | * | 7/2002 | Tsunekawa et al. ....... 428/141 |
| 6,517,762 | B1 | * | 2/2003 | Tsunekawa et al. ...... 264/290.2 |
| 7,001,557 | B2 | * | 2/2006 | Tsunekawa et al. ...... 264/210.7 |
| 2002/0022099 | A1 | * | 2/2002 | Schmidt et al. .......... 428/35.7 |

FOREIGN PATENT DOCUMENTS

| | | |
|---|---|---|
| EP | 0 229 255 A2 | 7/1987 |
| EP | 0 229 346 A1 | 7/1987 |
| EP | 0 755 975 A2 | 1/1997 |
| EP | 0 930 330 A2 | 7/1999 |
| EP | 0 960 718 A1 | 12/1999 |
| EP | 0 992 530 A1 | 4/2000 |
| JP | 7-25187 A | 1/1995 |
| JP | 2000-143820 A | 5/2000 |
| WO | WO 94/13482 A1 | 6/1994 |
| WO | WO 94/13483 A1 | 6/1994 |

OTHER PUBLICATIONS

Schimtz, Peter et al., "Films." Ullmann's Encyclopedia of Industrial Chemistry, 5th Ed., vol. A11 (1988), pp. 85-95, 105-106, 108-110.*

* cited by examiner

*Primary Examiner*—Vivian Chen
(74) *Attorney, Agent, or Firm*—DLA Piper US LLP

(57) ABSTRACT

In order to provide a film having excellent heat resistance, thermal dimensional stability, and mechanical properties, in particular, a film capable of satisfying required properties, e.g., higher strength in accordance with the reduction in thickness of a base film, improved thermal dimensional stability and mechanical properties in a use environment, and higher heat resistance and improved thermal dimensional stability in accordance with the needs for miniaturization and more functionality in electrical and electronic areas, a thermoplastic resin is allowed to contain transition metal oxide particles, and is formed into a biaxially oriented thermoplastic resin film, wherein the melting point of the film is allowed to become higher than the melting point of the thermoplastic resin to be used. Preferably, the difference between a peak temperature (melting point $T_1$) of the heat of fusion in the first run of the measurement of the biaxially oriented thermoplastic resin film with a differential scanning calorimeter (DSC) and a peak temperature (melting point $T_2$) of the heat of fusion in the second run is allowed to satisfy the following Formula.

$$2°\ C. \leq T_1 - T_2 \leq 30°\ C.$$

Alternatively, the plane orientation factor of the biaxially oriented thermoplastic resin film containing the transition metal oxide particles is controlled at 0.120 or more and less than 0.280.

22 Claims, No Drawings

BIAXIALLY ORIENTED THERMOPLASTIC RESIN FILM

TECHNICAL FIELD

This disclosure relates to a biaxially oriented thermoplastic resin film having significantly improved quality. In particular, it relates to a biaxially oriented thermoplastic resin film which has excellent heat resistance, thermal dimensional stability, and mechanical properties and which is a film suitable for various industrial materials, for example, magnetic recording media, circuit materials, capacitors, thermal transfer ribbons, and cards.

BACKGROUND

Plastic films are used in areas of magnetic recording, agriculture, packaging, building materials, and the like, in which demand is great, because of advantages in properties, e.g., the strength, the durability, the transparency, the flexibility, and impartation of surface properties. Most of all, biaxially oriented polyester films are used in various areas because of excellent mechanical properties, thermal properties, electrical properties, and chemical resistance. In particular, the usefulness for magnetic recording media is far ahead of other films. However, the dimensional stability and the heat resistance of the polyester film are inadequate depending on uses and, therefore, there is a limitation of application to various industrial material films. For example, in the magnetic recording medium use, reduction in thickness and higher density recording are pursued for miniaturization and long-duration recording, and requirements for higher strength and improvement of form stability and thermal dimensional stability in a use environment of a base film have become even more intensified. In the circuit material use and the like, requirements for films having highly balanced heat resistance, thermal dimensional stability, mechanical strength, chemical resistance, and the like have been intensified in accordance with the needs for miniaturization and more functionality in electrical and electronic areas.

Research was previously conducted on methods in which polyesters were allowed to contain particles and, thereby, fibers and resin moldings were allowed to have high strength. As a result, a method in which fibers have been allowed to contain metal oxide fine particles having particle diameters of 100 nm or less and, thereby, the strength and the dimensional stability of the fibers have been improved (Japanese Unexamined Patent Application Publication No. 1-192820), a method in which a metal complex coordinated with glycols has been added to a polyester-based resin by polymerization, the metal has been reduced to an element, and fine particles of a metal, e.g., palladium, have been finely dispersed into a polymer so as to allow a resin molding to have a high modulus of elasticity (Japanese Unexamined Patent Application Publication No. 10-298409), and the like have been proposed. However, there is no example in which these technologies are applied to films and, in contrast to the present invention, it was not an object to raise the melting point of the film, and to improve the heat resistance and the thermal dimensional stability of the film.

Research was conducted on methods in which biaxially oriented polyester films were allowed to contain particles. Examples of methods include a method in which particles having particle diameters of less than 300 nm of oxides of fifth and sixth period elements in the periodic table of elements (Japanese Unexamined Patent Application Publication No. 3-115437 and the like) are contained in a film. It is a primary object of those proposed methods to form a film surface and improve the scratch resistance, and it is not an object to improve the heat resistance, the thermal dimensional stability, and the mechanical properties of the film.

It would therefore be advantageous to provide a high-quality biaxially oriented thermoplastic resin film having excellent heat resistance, thermal dimensional stability, and mechanical properties. In particular, it would be advantageous to provide a biaxially oriented thermoplastic resin film which significantly improves practical properties which have been taken seriously in various uses. Example of properties to be improved include the running durability in the magnetic recording medium use, the flatness and the warp during processing in the circuit material use, the heat resistance in the capacitor use, shift of printing in the ribbon use, and shift of a circuit in the card use.

SUMMARY

We found that when transition metal oxide particles were blended in a specific dispersion state, interaction between a thermoplastic resin and the particles was significantly enhanced, a cross-linking structure was formed between the molecular chain/particles and, thereby, the storage modulus at a high temperature was improved, the melting point became higher, and industrially outstanding film was provided, which had excellent heat resistance, thermal dimensional stability, and mechanical properties and which was useful in various film uses. The result was a biaxially oriented thermoplastic resin film composed of a thermoplastic resin containing transition metal oxide particles, wherein the melting point of the biaxially oriented thermoplastic resin film is higher than the melting point of the thermoplastic resin to be used. A biaxially oriented thermoplastic resin film is composed of a thermoplastic resin containing transition metal oxide particles, wherein the difference between a peak temperature (melting point $T_1$) of the heat of fusion in the first run of the measurement of the biaxially oriented film with a differential scanning calorimeter (DSC) and a peak temperature (melting point $T_2$) of the heat of fusion in the second run satisfies the following Formula (1).

$$2° C. \leq T_1 \ T_2 \leq 30° C. \quad (1)$$

The thermoplastic resin is a resin primarily containing at least one selected from the group consisting of a polyester, a polyphenylene sulfide, a polyolefin, a polyamide, a polyimide, a polycarbonate, and a polyetheretherketone. When the thermoplastic resin is a polyester, the plane orientation factor is 0.120 or more and less than 0.280. A magnetic recording medium, a circuit material, a capacitor, a thermal transfer ribbon, and a card, each including the above-described biaxially oriented thermoplastic resin film, are provided.

DETAILED DESCRIPTION

A biaxially oriented thermoplastic resin film is a film primarily containing a thermoplastic resin and transition metal oxide particles.

The thermoplastic resin is not specifically limited, and may primarily contain at least one selected from the group consisting of a polyester, a polyphenylene sulfide, a polyolefin, a polyamide, a polyimide, a polycarbonate, a polyetheretherketone, a polysulfone, a polyethersulfone, a polyallylate, a vinyl chloride-based resin, a styrene-based resin, an acrylic resin, a polyacetal, a fluororesin, and the like. Preferably, the primary component constitutes at least 50 percent by weight, more preferably at least 70 percent by weight, and further preferably at least 90 percent by weight. A polyester, a polyphenylene sulfide, a polyolefin, a polyamide, a polyimide, a polycarbonate, and a polyetheretherketone are preferable in terms of improvement of the heat resistance, the thermal dimensional stability, and the mechanical properties of the film. A polyester and a polyphenylene sulfide are particularly preferable.

The polyester is not specifically limited. However, preferably, the primary constituent is at least one structural unit selected from the group consisting of ethylene terephthalate, ethylene-2,6-naphthalate, hexamethylene terephathalate, cyclohexanedimethylene terephthalate, ethylene-α,β-bis(2-chlorophenoxy)ethane-4,4'-dicarboxylate, butylene terephthalate, butylene-2,6-naphthalate, and butylene-α,β-bis(2-chlorophenoxy)ethane-4,4'-dicarboxylate units. Preferably, the primary component constitutes at least 50 percent by weight, more preferably at least 70 percent by weight, and further preferably at least 90 percent by weight. With respect to the liquid crystal polyester resin, known liquid crystal polyesters described in, for example, U.S. Pat. No. 4,552,948 may be used. A liquid crystal polyester containing 40 to 90 percent by weight of parahydroxybenzoic acid (HBA) component as a primary mesogen and, in addition, containing 4,4'-dihydroxybiphenyl (DHB) to improve the fluidity is preferable. The form of inclusion of the mesogen may be any form, e.g., random copolymerization, block copolymerization, branch copolymerization, and complex copolymerization of combination thereof. A liquid crystal resin composed of, e.g., polyethylene terephathalate (PET) or polyethylene naphthalate (PEN)/HAB/DHB/isophthalic acid (IPA) or terephthalic acid (TPA), a copolymer primarily containing HBA/6-hydroxy-2-naphthoic acid, a copolymer of HBA/4,4'-dihydroxybiphenyl and terephathalic acid or isophthalic acid, a copolymer of HBA/hydroquinone (HQ)/sebacic acid (SA), and the like are preferable. Commercially available compounds may be used for them, and Siveras produced by Toray Industries, Ltd., UENO-LCP produced by Ueno Fine Chemicals Industry, Ltd., and the like may be used. A polyester primarily containing polyethylene terephthalate (hereafter referred to as PET) and/or polyethylene naphthalate (hereafter referred to as PEN) is particularly preferable in terms of the mechanical properties, the dimensional stability, and the productivity. Furthermore, a plurality of polymers may be blended.

A polyphenylene sulfide (PPS) resin refers to a resin containing at least 70 mole percent of poly-para(P)-phenylene sulfide. This is because if the content is less than the above-described value in the composition, properties, e.g., the heat resistance, the dimensional stability, and the mechanical properties, become poor. The above-described resin may contain a poly-meta(m)-phenylene sulfide polymer or small amounts, e.g., within the range of less than 30 mole percent, of other monomers having an aryl group, a biphenyl group, a terphenyl group, a vinylene group, a carbonate group, or the like copolymerized in any form.

Preferably, the molecule of the PPS resin is a straight chain linear polymer having a molecular weight of at least 50,000, although not always limited to this. The polymer may have a branched chain, or have a partially cross-linked structure.

Low molecular weight oligomers contained in the PPS resin may be removed by cleaning with a solvent, e.g., diphenyl ether. Preferably, the amount of oligomers is controlled at 1.5 percent by weight or less through extraction in boiling xylene for 36 hours.

Methods for manufacturing these PPS resins are referred to, for example, the method described in U.S. Pat. No. 3,354,129.

Preferably, the intrinsic viscosity of a polyester raw material is 0.55 to 2.0 dl/g, more preferably to 0.6 to 1.4 dl/g, and most preferably is 0.70 to 1.0 dl/g from the viewpoint of the stability in the film making process, the kneading property with particles, the decomposition property during melt extrusion, and the like.

Preferably, the melt viscosity of a polyphenylene sulfide raw material is 500 to 30,000 poise, more preferably is 1,000 to 15,000 poise, and further preferably is 2,000 to 10,000 poise.

The transition metal oxide particles are not specifically limited. However, oxide particles of V A group, VI A group, VII A group, VIII group, and I B group transition metals in the periodic table of elements are preferable, and oxide particles of V A group, VI A group, VII A group, VIII group, and I B group transition metals of the fourth period in the periodic table of elements are more preferable. For example, particles of vanadium oxide, chromium oxide, manganese oxide, iron oxide, cobalt oxide, nickel oxide, copper oxide, niobium oxide, molybdenum oxide, technetium oxide, ruthenium oxide, rhodium oxide, palladium oxide, and silver oxide may be used. In the film, manganese oxide, iron oxide, copper oxide, and the like are preferable, and copper oxide and yellow iron oxide of the fourth period in the periodic table of elements are most preferable from the viewpoint of the heat resistance, the thermal dimensional stability, the mechanical properties, and the stability of quality. Preferably, a primary component constituting the transition metal oxide particles is copper oxide. In this case, preferably, the content of copper oxide in the particle is at least 50 percent by weight, more preferably is at least 60 percent by weight, and further preferably is at least 70 percent by weight. When copper oxide particles are used, either cuprous oxide or cupric oxide may be used. However, cupric oxide is preferable from the viewpoint of the heat resistance, the thermal dimensional stability, the mechanical properties, and the stability of quality. Preferably, the weight fraction of cupric oxide in copper oxide is at least 50 percent by weight, more preferably is at least 60 percent by weight, and further preferably is at least 70 percent by weight. At least two types of particles may be contained in combination. The particles contained may be in the shape of any one of a sphere, a needle, and a plate, although not specifically limited. The shape of a sphere is preferable from the viewpoint of the smoothness of the film surface.

Commercially available particles may be used for these transition metal oxide particles. For example, Nanotek produced by Nanophase Technologies Corporation may be used. More preferably, these particles are subjected to a surface treatment and, thereby, the film can be readily provided.

Preferably, an average primary particle diameter of the transition metal oxide particles is within the range of 3 to 120 nm. In order to control the average primary particle diameter of particles in the film within the above-described range, addition to the resin may be performed by the use of transition metal oxide particles having an average primary particle diameter of 3 to 120 nm. Particles having an average primary particle diameter smaller than the above-described range are hardly available industrially. If larger than the above-described range, the film has poor stability in stretching and, therefore, the film tends to be broken during the film making process. Preferably, the average primary particle diameter is within the range of 5 to 100 nm, and most preferably is within the range of 10 to 50 nm.

Preferably, an average secondary particle diameter of the transition metal oxide particles present in the film is within the range of 3 to 250 nm from the viewpoint of the heat resistance, the thermal dimensional stability, the mechanical properties, the stability in the film making process, and coarse protrusions on the film surface. In general, it is difficult to allow the average secondary particle diameter to become smaller than the above-described range. If larger than the above-described range, it must be noted that the stability in the film making process tends to become poor and, thereby, coarse protrusions may be generated on the film surface, depending on applications, e.g., high-density magnetic tapes. More preferably, the average secondary particle diameter is within the range of 5 to 150 nm, and most preferably is within the range of 10 to 100 nm.

Preferably, the content of the transition metal oxide particles in the thermoplastic resin film is 0.001 to 5 percent by weight from the viewpoint of the heat resistance, the thermal dimensional stability, and the mechanical properties of the film. More preferably, the content is 0.02 to 2 percent by weight, and most preferably is 0.1 to 1.5 percent by weight. If the content is smaller than the above-described range, the heat resistance, the thermal dimensional stability, and the mechanical properties of the film may not be adequately improved. If the content exceeds the above-described range, undesirably, aggregation of particles occur, Extrusion becomes unstable during making a film, and the film tends to be broken.

If necessary, the transition metal oxide particles may be subjected to a particle surface treatment, e.g., a silane coupling treatment or a titanium coupling treatment, for the purpose of enhancing the affinity for a base resin and controlling the aggregation. The particle surface may be coated by an organic treatment. Inorganic particles, organic particles, and other various additives, for example, antioxidant, ultraviolet absorber, antistatic agents, crystallization nucleators, flame retardants, pigments, dyes, fatty esters, organic lubricants, e.g., wax, and inert particles, which are different from the transition metal oxide particles of the present invention, may be added within the bounds of not impairing the properties of the film. Specific examples of inorganic particles may include carbonates, e.g., calcium carbonate and barium carbonate; sulfates, e.g., calcium sulfates and barium sulfates; titanates, e.g., barium titanate and potassium titanate; and phosphates, e.g., calcium tertiary phosphate, calcium secondary phosphate, and calcium primary phosphate, although not limited to them. At least two of them may be used in accordance with purposes. Specific examples of organic particles may include vinyl-based particles, e.g., polystyrene or cross-linked polystyrene particles, styrene-acrylic and acrylic cross-linked particles, and styrene methacrylic and methacrylic cross-linked particles; and particles of, e.g., benzoguanamine-formaldehyde, silicone, and polytetrafluoroethylene, although not limited to them. The particle diameters, the amounts of mixing, and the shapes of these particles can be selected in accordance with uses and purposes. In general, preferably, the average particle diameter is 0.01 μm or more and 3 μm or less, further preferably is 0.05 μm or more and 1 μm or less, and the amounts of mixing is 0.001 percent by weight or more and 5 percent by weight or less.

It is important that the melting point of the biaxially oriented thermoplastic resin film is higher than the melting point of the thermoplastic resin to be used. Preferably, the melting point is at least 1° C. higher than the melting point of the thermoplastic resin to be used, and more preferably is at least 2° C. higher than that. The melting point of the biaxially oriented thermoplastic resin film may be measured as a peak temperature (melting point $T_1$) of the heat of fusion in the first run of the measurement with a differential scanning calorimeter (DSC). The melting point of the thermoplastic resin to be used may be measured as a peak temperature (melting point $T_2$) of the heat of fusion in the second run of the DSC measurement. It is important that the difference between the peak temperature (melting point $T_1$) of the heat of fusion in the first run of the DSC measurement and the peak temperature (melting point $T_2$) of the heat of fusion in the second run of the measurement satisfies the following Formula (1), $$2° C. \leq T_1-T_2 \leq 30° C. \tag{1}$$

More preferably the difference is within the range of 3° C. or more and 25° C. or less, and most preferably is within the range of 5° C. or more and 20° C. or less.

However, when the thermoplastic resin to be used is a resin in which a molecular chain has a partially cross-linked structure, such as polyphenylene sulfide, with respect to the above-described Formula (1), 5° C. or more and 30° C. or less is more preferable, and 12° C. or more and 25° C. or less is most preferable.

With respect to the above-described Formula (1), when the difference between the melting points is at least 2° C., practical properties are adequately improved in all expected uses. It is industrially difficult to allow the difference between the melting points to become a value exceeding 30° C.

With respect to the transition metal oxide particles present in the biaxially oriented thermoplastic resin film, preferably, the number of coarse aggregates of at least 3 μm is 30 per 100 cm² or less. Preferably, the number of coarse aggregates is 20 per 100 cm² or less, and more preferably is 10 per 100 cm² or less. If the number of coarse aggregates of at least 3 μm present in the film exceeds 30 per 100 cm², it must be noted that clogging of the filter may occur during extrusion for the film making process, and the stability in the film making process may be deteriorated due to frequent occurrences of breaking. Particularly, in the high-density magnetic recording use, if coarse aggregates are present, the electromagnetic conversion property and the error rate are significantly deteriorated, and it becomes difficult to provide a practically usable film.

Preferably, the content of chlorine in the transition metal oxide particle (may be referred to as chlorine concentration) is within the range of 0.001 to 10 percent by weight. If the content is larger than 10 percent by weight, it is noted that the heat resistance, the thermal dimensional stability, and the mechanical properties of the film are not readily improved. More preferably, the content is within the range of 0.005 to 5 percent by weight, and most preferably is within the range of 0.01 to 1 percent by weight.

Preferably, the area percentage of voids present in the biaxially oriented thermoplastic resin film is 0 percent or more and 5 percent or less, further preferably is 0 percent or more and 3 percent or less, and most preferably is 0 percent or more and 1 percent or less. If the void area percentage exceeds the above-described range, it must be noted that the mechanical properties, e.g., the Young's modulus and the elongation at break, of the film are deteriorated and the heat shrinkage is increased.

In order to improve the heat resistance, the thermal dimensional stability, and the mechanical properties, the biaxially oriented thermoplastic resin film must be a film stretched in the machine direction and in the transverse direction, that is, a biaxially stretched film (hereafter, the machine direction may be referred to as the longitudinal direction and the transverse direction may be referred to as the lateral direction). Examples of methods for stretching films include a simultaneous biaxial stretching method in which a longitudinal stretching and a lateral stretching are performed simultaneously, a sequential biaxial stretching method in which a longitudinal stretching and a lateral stretching are performed sequentially and, in addition, a so-called "longitudinal re-stretching" method in which a film sequentially stretched in two directions of longitudinal and lateral directions is stretched again in the longitudinal direction to enhance the strength in the longitudinal direction, a longitudinal re-stretching and lateral re-stretching method in which after the above-described longitudinal re-stretching is performed, the film is stretched again in the lateral direction to further enhance the strength in the lateral direction as well, and a multi-step longitudinal stretching method in which a film is stretched in a longitudinal direction in at least two steps and, subsequently, the film is stretched in a lateral direction. Even when the film including particles according to the present invention is stretched, voids may be generated between the particles and a polymer serving as a base material. Consequently, it is preferable that a heat treatment or the like is performed at a temperature higher than or equal to the glass transition temperature Tg of the polymer in any step after the stretching in one direction is performed and, thereby, voids are reduced, although not limited to this.

It is important that the plane orientation factor of the biaxially oriented polyester film is within the range of 0.120 or more and less than 0.280 from the viewpoint of improvement of the heat resistance, the thermal dimensional stability, and the mechanical properties. If the film is not provided with orientation and the plane orientation factor is smaller than the above-described range, a high Young's modulus may not be attained, and requirements may not be adequately satisfied in the magnetic recording film use. If the film is provided with excessive orientation and the plane orientation factor is larger than the above-described range, it must be noted that the elongation at break is reduced. In particular, when the polyester primarily contains ethylene terephthalate, preferably, the plane orientation factor is within the range of 0.165 or more and less than 0.200 in order to clearly exert the selected effects, more preferably is within the range of 0.175 or more and less than 0.190, and most preferably is within the range of 0.178 to 0.190. In particular, when the polyester primarily contains ethylene-2,6-naphthalate, more preferably, the plane orientation factor is within the range of 0.210 or more and less than 0.280 and most preferably is within the range of 0.240 or more and less than 0.280.

Preferably, the intrinsic viscosity (IV) of the biaxially oriented thermoplastic resin film is 0.55 dl/g or more and 2.0 dl/g or less; reduction of surface defects, foreign matters, surface coarse protrusions, and stability in the film making process. Preferably, the intrinsic viscosity is within the range of 0.60 to 0.85 dl/g, and most preferably is within the range of 0.65 to 0.80 dl/g. If the intrinsic viscosity of the film is less than 0.55, film breaking tends to occur during the film making process and, thereby, it is difficult to form the film stably. If the intrinsic viscosity exceeds 2.0, it must be noted that the shear heat generation becomes large during the melt extrusion of the film, thermally decomposed gelled materials are increased in the film and, thereby, a high-quality film is not readily provided.

The thickness of the biaxially oriented thermoplastic resin film may be appropriately determined in accordance with uses and purposes. However, the thickness is preferably within the range of 0.5 to 300 μm. More preferably, the thickness of the film is less than 150 μm and further preferably is less than 10 μm. Preferably, the thickness is within the range of 1 μm or more and 15 μm or less in the application to the magnetic recording material, is within the range of 2 μm or more and 10 μm or less in the application to the coating type magnetic recording medium for data, and is within the range of 3 μm or more and 9 μm or less in the application to the evaporation type magnetic recording medium for data. In general, the thickness of 10 to 300 μm is preferably adopted in the application to the circuit material. The thickness of 50 to 200 μm is more preferable, and 70 to 150 μm is further preferable. The film thickness of 0.5 to 15 μm is preferably adopted in the application to the capacitor. This is because when the film thickness is within this range, the resulting film has excellent dielectric breakdown voltage and dielectric properties. Preferably, the film thickness is 1 to 6 μm in the application to the thermal transfer ribbon, and more preferably is 2 to 4 μm. This is because when the film thickness is within this range, no wrinkle is generated during printing, variations in printing and excessive transfer of ink do not occur and, therefore, high-precision printing can be performed. With respect to films used for plate making, magnetic recording cards, and IC cards, preferably, the film thickness is 30 to 150 μm, and more preferably is 70 to 125 μm.

Preferably, variations in the thickness of the film in the machine direction are less than 15 percent from the viewpoint of broadening the range of application to various films and stability in the film making process. More preferably, variations in the thickness of the film are less than 10 percent, and further preferably are less than 8 percent, and most preferably are 6 percent or less.

Preferably, the total of the Young's modulus in the machine direction and that in the transverse direction of the biaxially oriented thermoplastic resin film is at least 9 GPa, preferably is at least 12 GPa in various applications to, for example, magnetic recording media, and preferably is 35 GPa or less from the viewpoint of the syability of the film making process. More preferably, the total is 14 GPa or more and 32 GPa or less, and most preferably is 15 GPa or more and 30 GPa or less.

Preferably, the total of the elongation at break in the machine direction and that in the transverse direction of the biaxially oriented thermoplastic resin film of the present invention is at least 120 percent from the viewpoint of reduction of surface defects, foreign matters, and surface coarse protrusions and the stability in film making process. Preferably, the elongation at break of the film is at least 150 percent, and further preferably is at least 180 percent.

Preferably, the heat shrinkage at 100° C. in the machine direction and/or transverse direction of the biaxially oriented polyester film is at least 0 percent in order to suppress occurrence of wrinkles due to thermal hysteresis during the processing step, and preferably is less than 1.0 percent in order to suppress track shift and the like of a magnetic tape. More preferably, the heat shrinkage is within the range of 0 to 0.8 percent, and most preferably is 0 to 0.5 percent. Preferably, the heat shrinkage at 150° C. in the machine direction and/or transverse direction of the film is 0 percent or more and less than 1.5 percent from the viewpoint of handling in various uses and improvement of the yield in the processing. More preferably, the heat shrinkage is within the range of 0 to 0.8 percent, and most preferably is 0 to 0.5 percent.

It is a preferable condition that the storage modulus of the biaxially oriented polyester film in the dynamic viscoelasticity measurement at 200° C. is 0.4 GPa or more and less than 3.0 GPa. More preferably, the storage modulus is 0.6 to 2.0 GPa, and most preferably is 0.8 to 1.5 GPa. If the storage modulus in the dynamic viscoelasticity measurement at 200° C. is less than 0.4 GPa, the thermal dimensional stability at a high temperature and the flatness in the processing are deteriorated. If the storage modulus exceeds 3.0 GPa, it must be noted that in many cases, the melt extrusion is not readily performed and the stability in the film making process is deteriorated. The storage modulus is a value measured with DMS6100 produced by Seiko Instruments Inc., at a frequency of 1 Hz in the dynamic viscoelasticity measurement in which temperature is raised from 26° C. to 240° C. at a temperature rise rate of 2° C./min.

The film may be a laminated film composed of at least two layers. In particular, the laminated film in which at least two layers are laminated is suitable for the use in a method for designing a film surface serving as a magnetic recording surface and a running surface opposite thereto to have different surface roughness in accordance with uses of base films of magnetic recording media.

With respect to a method for manufacturing a film, a specific example of the method for manufacturing a biaxially oriented thermoplastic resin film will be described with reference to the case of a polyester. However, this disclosure is not limited.

A polyester resin may be manufactured by a previously known method. Transition oxide particles to be added to a predetermined polyester resin may be added in any stage before polymerization, during polymerization, or after polymerization in the resin manufacturing process. However, in order to satisfy the range of coarse aggregates, for example, in the case of PET or PEN, (a) a method in which the particles in the form of slurry are kneaded with the polymer by the use of a vent type twin screw kneading extruder and (b) a method in which the particles are added to ethylene glycol and the like, which is a diol component used as the material, by mixing and dispersing in the form of slurry are adopted preferably. A method in which a slurry containing dispersed particles is added to a twin screw kneading extruder and, thereby, is kneaded with a polymer is most preferable. Preferably, the L/D of the twin screw kneading extruder used is at least 25, and more preferably is at least 30. Preferably, the residence time of the polyester resin is 10 seconds or more and 90 seconds or less, more preferably is 20 seconds or more and 80 seconds or less, and further preferably is 30 seconds or more and 70 seconds or less. At this time, to prevent aggregation of the particles, a surface treating agent of the particle may be used by a known method in accordance with the type of the polyester resin. Examples of usable surface treating agents include anionic surfactants, e.g., sodium dodecylbenzenesulfonate, lithium dodecylbenzenesulfonate, sodium lauryl sulfate, sodium dialkylsulfosuccinate, and naphthalenesulfonic acid formalin condensate salt; nonionic surfactant, e.g., polyoxyphenol ether, polyethylene glycol monostearate, and stearic acid monostearate, and metal salts thereof; water-soluble synthetic polymers, e.g., polyvinyl alcohol, polyvinyl pyrrolidone, and polyethylene glycol; water-soluble natural polymers, e.g., gelatin and starch; water-soluble semisynthetic polymers, e.g., carboxymethyl cellulose; silane-based and titanium-based coupling agents; and phosphoric acid compounds, e.g., phosphoric acid, phosphorous acid, phosphonic acid, and derivatives thereof. With respect to a method for physically mixing these surface treating agents, a grinder, e.g., a roll mill, a high-speed rotary grinder, or a jet mill; or a mixer, e.g., a Nauta mixer, a ribbon mixer, or a Henschel mixer, may be used. A media dispersion method in which glass beads are used as media is particularly effective as a method for dispersing particles in a slurry. Preferably, glass beads to be used have diameters of 10 to 300 μm, more preferably of 30 to 200 μm, and the diameter of 50 to 100 μm is most preferable from the viewpoint of the dispersion property of the particles. Preferably, the agitation speed is 2,000 to 8,000 rpm, more preferably is 3,000 to 7,000 rpm, and 4,000 to 6,000 rpm is most preferable. Preferably, the agitation time is 1 to 9 hours, more preferably is 3 to 7 hours, and most preferably is 4 to 6 hours. Preferably, the media are mixed with the same volume of slurry to be used and are dispersed. The slurry may be a water slurry, an ethylene glycol slurry, or the like, which may be appropriately selected in accordance with the types of polymer and particles to be used. Most preferably, a surface treating agent is added to the slurry to disperse the media at this time. After the media are dispersed, preferably, filtration is performed with a 5 μm cut filter, preferably with a 3 μm cut filter, and most preferably with a 1 μm cut filter. The cut filter to be used is not specifically limited, and may be appropriately selected in accordance with the particles to be used.

Preferably, the chlorine content of the transition metal oxide particles is reduced before addition to the resin by, for example, a method in which cleaning is performed with hot water and, subsequently, drying is performed under a reduced pressure.

In a preferable method used for adjusting the content of particles in the film, master pellets containing the particles at a high concentration are prepared by the above-described method, and the resulting master pellets containing the particles at a high concentration are diluted with a polymer containing substantially no particle and the like during the film formation.

The resulting polyester resin pellets containing these particles are adequately dried, if necessary, and thereafter, are fed into an extruder heated to a temperature higher than or equal to the melting point of the polyester resin in a nitrogen stream or under a reduced pressure in order that the inherent viscosity is not decreased. Preferably, the screw shear rate (=πDN/(60)h; D: screw diameter (cm), N: screw rotational speed (rpm), h: groove depth (cm) of screw metering zone) of the extruder to be used is 50 to 1,000 sec$^{-1}$, more preferably is 90 to 500 sec$^{-1}$. Further preferably, the screw shear rate is 150 to 300 sec$^{-1}$ from the viewpoint of prevention of the thermal decomposition of the thermoplastic resin and the dispersibility of the thermoplastic resin and the particles. The screw used for melt extrusion may be a screw in any shape, such as of a full-flighted type or a barrier-flighted type. However, it is preferable that various mixing type screws having the ratio (L/D) of the length (L) to the diameter (D) of the screw of at least 20, preferably of at least 25 are used from the viewpoint of enhancement of the particle dispersibility of the thermoplastic resin and particles and reduction of coarse aggregates. The mixing type screw refers to a screw having a mixing zone at a position in the screw compression zone, in the screw metering zone, or at the midpoint therebetween, and may be a screw having a fluted barrier, Dulmage, Unimelt, multiple pin, or the like. The extruder may be either of a single screw type or a twin screw kneading type, and it is effective to use a high-shear low-heat type screw. In the case of a single screw type, a tandem extruder may also be used preferably. The polymer discharge time is preferably controlled at 90 seconds or more and 6 minutes or less, and more preferably is 2 minutes or more and 4 minutes or less. Subsequently, the melted polymer is extruded from a nozzle, and is cooled on a casting drum having a surface temperature lower than or equal to the glass transition temperature of the polyester resin, so that an unstretched film is prepared. In order to remove foreign matter and deteriorated polymers in melt extruders, preferably, various filters, for example, filters composed of sintered metal, porous ceramic, sand, wire mesh, or other materials are used. Preferably, the filtration accuracy of the filter is appropriately selected in accordance with transition metal oxide particles to be used and particle diameters of inert particles.

In the case where a thermoplastic resin containing spherical inert particles is laminated on the film surface layer or in the case where other layers are laminated, respective chips are separately fed into at least two melt extruders after being adequately dried, and are joined by the use of a manifold with two or necessary number of layers or a joining block. Subsequently, a multilayer sheet is extruded from a nozzle, and is cooled on a casting drum having a surface temperature of −20° C. to 60° C., so that an unstretched film is prepared. At this time, a method in which lamination is performed by the use of a joining block with a joining zone having a rectangular cross section is effective to thinly and uniformly laminate a thermoplastic resin containing various inert particles. A method in which a static mixer or a gear pump is disposed in a flow path of these polymers is effective to reduce variations in thickness of the film.

Subsequently, the resulting unstretched film is stretched in the film machine direction and/or transverse direction. The stretching methods include a sequential biaxial stretching method in which the unstretched film is sequentially stretched in a longitudinal direction and a lateral direction with rolls or a stenter. A simultaneous biaxial stretching method in which the unstretched film is stretched simultaneously in a longitudinal direction and a lateral direction with a stenter is effective because steps are simplified and breaking due to stretching is resistant to occurring compared with those in the sequential biaxial stretching method. A longitudinal re-stretching method in which a film sequentially stretched in both the longitudinal and the lateral direction is further stretched in the longitudinal direction is extremely effective to increase the strength in the longitudinal direction. A longitudinal re-stretching and lateral re-stretching method in which stretching is further performed in the lateral direction following the above-described longitudinal re-stretching method is extremely effective to further increase the strength in the lateral direction as well. A multi-step longitudinal stretching method in which at least two steps of stretching is performed in the film longitudinal direction and, subsequently, stretching is performed in the film lateral direction may also be used in the present invention.

For example, when the sequential biaxial stretching is used, the condition of the stretching in the machine direction is not specifically limited. However, preferably, the stretching speed is 10,000 to 150,000 percent/min, the stretching temperature is within the range of the glass transition temperature Tg of the polyester resin or higher and (the glass transition temperature +50° C.) or lower. Preferably, the stretching ratio is within the range of 2.5 to 10 times, further preferably is 3.0 to 5 times. A uniaxially oriented film is prepared by the stretching in the machine direction as described above.

Since voids may tend to occur depending on, for example, the combination of the polyester resin and the transition metal oxide particles, preferably, the uniaxially oriented film prepared by the above-described method is heat-treated at the inlet of the tenter at the melting point Tm of the polyester resin or lower and the glass transition temperature Tg or higher in order to reduce the amount of voids in the film. More preferable heat treatment temperature is (the glass transition temperature Tg +20° C.) or higher and (the melting point Tm −100° C.) or lower.

The subsequent stretching in the transverse direction may be performed with a known tenter, while the stretching temperature is controlled at within the range of the glass transition temperature Tg of the polyester resin or higher and (the glass transition temperature Tg +80° C.) or lower, more preferably at the glass transition temperature Tg of the polyester resin or higher and (the glass transition temperature Tg +40° C.) or lower, and the stretching ratio may be controlled at within the range of 2.0 to 10 times, and more preferably at 2.5 to 5 times. The stretching speed at that time is not specifically limited, but preferably is 1,000 to 50,000 percent/min. If necessary, the resulting biaxially oriented film may be further stretched in at least one direction of the machine direction and the transverse direction. In this case, with respect to the longitudinal stretching performed again, preferably, the stretching temperature is within the range of (the glass transition temperature Tg of the polyester resin +20° C.) or higher and (the glass transition temperature Tg +120° C.) or lower, more preferably is (the glass transition temperature Tg +50° C.) or higher and (the glass transition temperature Tg +100° C.) or lower, the stretching ratio is preferably within the range of 1.2 to 2.5 times, and more preferably is within the range of 1.2 to 1.7 times. With respect to the lateral stretching subsequently performed again, preferably, the stretching temperature is within the range of (the glass transition temperature Tg of the polyester resin +20° C.) or higher and (the glass transition temperature Tg +150° C.) or lower, more preferably is (the glass transition temperature Tg +50° C.) or higher and (the glass transition temperature Tg +130° C.) or lower, the stretching ratio is preferably within the range of 1.02 to 2 times, and more preferably is within the range of 1.1 to 1.5 times.

Subsequently, in order to reduce the void area percentage, to reduce the heat shrinkage, and the like, a heat treatment is performed, if necessary. Preferably, the heat treatment is performed at within the range of (the melting point of the thermoplastic resin) to (the melting point of the thermoplastic resin −100° C.) for 0.5 to 60 seconds under the condition of any one of constant length, slight stretching, and relaxed state.

In the case where the stretching is performed by the simultaneous biaxial stretching, a method in which the simultaneous biaxial stretching is performed with a tenter having a driving system through the use of a linear motor is preferable. Preferably, the temperature in the simultaneous biaxial stretching is the glass transition temperature Tg of the polyester resin or higher and (the glass transition temperature Tg +50° C.) or lower. If the stretching temperature is significantly out of this range, undesirably, uniform stretching becomes impossible, and variations in the thickness and film breaking occurs. The stretching ratio may be 3 to 10 times both in the longitudinal direction and in the lateral direction. The stretching speed is not specifically limited, and preferably is 2,000 to 50,000 percent/min. In the case of re-stretching, preferably, a heat treatment is performed in order to reduce the void area percentage, to reduce the heat shrinkage, and the like.

The films biaxially oriented and subjected to the heat treatment by respective methods as described above are gradually cooled to room temperature and are taken up with winders. In a preferable cooling method, gradual cooling to room temperature is performed in at least two stages. At this time, a treatment for relaxation by 0.5 to 10 percent in the machine direction and the transverse direction is effective to reduce the thermal dimensional change for including thermal shrinkage. Preferably, the cooling temperatures are within the range of (the heat treatment temperature −20° C.) to (the heat treatment temperature −80° C.) at the first stage and (the first stage cooling temperature −30° C.) to (the first stage cooling temperature −60° C.) at the second stage, although not limited to this.

The biaxially oriented thermoplastic resin film may be preferably used for magnetic recording media, circuit materials, capacitors, thermal transfer ribbons, and cards. With respect to magnetic recording media, the film may be preferably used for high-density magnetic recording media, e.g., digital videos and data storage tapes, although not limited to them. With respect to circuit materials, the film may be used for circuit boards, e.g., flexible printed circuit boards (FPC) having electric circuits on at least one surface of a biaxially oriented thermoplastic resin film, multilayer circuit boards, build-up circuit boards, and films used for semiconductor package (TAB), and for circuit board protection films, e.g., coverlay. With respect to capacitor uses, capacitors may be of any type, e.g., with a lead or with no lead (so-called chip capacitor), although not limited to them. With respect to thermal transfer ribbons, the film is used for any transfer system, e.g., a thermal ink transfer system or a thermal sublimation transfer system. In the case of the thermal sublimation system, a base film is required to have high heat resistance and, therefore, the biaxially oriented thermoplastic resin film of the present invention is used preferably. With respect to cards, the film can be applied to cards capable of recording information, in particular, cards capable of magnetically, electrically, or optically reading and/or writing; and/or cards capable of recording information by embossing. Specifically, the film is suitable for magnetic cards, e.g., contact type IC cards, non-contact type IC cards wherein IC chips and antenna circuits are embedded in the cards, and magnetic stripe cards; optical cards; and the like. More specific examples of cards may include prepaid cards, credit cards, banking cards, various identification cards, and driver's license cards.

Methods for Measuring Properties and Methods for Evaluating Effects

Methods for measuring characteristic values and methods for evaluating effects will be described below.

(1) Melting Points of Film and Thermoplastic Resin

RDC-220 Robot DSC produced by Seiko Denshi Kogyo K. K. was used, and Disk Session SSC/5200 produced by the same manufacturer was used as a data analyzer. A sample was taken by 5 mg, and the melting point of a biaxially oriented film was measured based on a peak temperature of the heat of fusion of the crystal during heating from room temperature to 300° C. at a temperature rise rate of 20° C./min. Subsequently, the sample was taken out into air, and was quenched. The melting point of the resin was measured based on a peak temperature of the heat of fusion of the crystal appeared when the resulting sample was heated again from room temperature to 300° C. at a temperature rise rate of 20° C./min.

(2) Average Primary Particle Diameter (R1) and Average Secondary Particle Diameter (R2) of Transition Metal Oxide Particles in Film The polymer was removed from the film by a plasma ashing treatment method, and particles were exposed. The treatment condition is selected in order that the polymer is ashed but the particles are not damaged. The resulting particles are observed with a scanning electron microscope (SEM), and the image of particles is processed with an image analyzer. The magnification of the SEM is appropriately selected to become about 2,000 to 100,000 times, and a field of view of one measurement is appropriately selected in order that one edge becomes about 10 to 50 μm.

The field of the observation is changed, and the average primary particle diameter (R1) and the average secondary particle diameter (R2) are determined while the number of particles measured is at least 500.

(3) Coarse aggregates in Film

An optical microscope is used, and a photograph of a film surface observed under magnification of 50 to 1,000 times is taken by a bright field transmission method. A field of view of one measurement is appropriately selected in order that one edge becomes about 50 to 100 μm. The field of the observation is changed, and the number of coarse aggregates of at least 3 μm is counted while the number of field of views is at least 100. The sample is ranked based on the number of coarse aggregates of at least 3 μm per 100 $cm^2$, and the number of 0 to 10 is ranked as ⊙, 11 to 20 is ranked as ◯, 21 to 30 is ranked as Δ, and more than 30 is ranked as ×.

(4) Particle Content in Film

A solvent which dissolves the polymer but not dissolve the particles is appropriately selected, and 100 g of film sample is dissolved in the solvent. The resulting polymer solution is treated with a centrifugal separator, so that the particles are separated. The polymer adhering to the resulting particles is dissolved by the solvent, and centrifugal separation is performed. This operation is repeated three times and, thereafter, the remaining particles are adequately washed with acetone. The weight of the resulting particles is measured.

When the polymer is not dissolved in any solvent, the measurement was performed by known fluorescent X-ray analysis. If necessary, quantification is performed by the use of pyrolysis gas chromatography, infrared absorption, Raman scattering, SEM-XMA, and the like.

(5) Intrinsic Viscosity

The value calculated from the solution viscosity measured in ortho-chlorophenol at 25° C. based on the following formula was adopted.

$$\eta sp/C=[\eta]+K[\eta]^2 \cdot C$$

where ηsp=(solution viscosity/solvent viscosity) −1, [η] represents an intrinsic viscosity, C represents the weight of polymer (g/100 ml, usually 1.2) dissolved per 100 ml of the solvent, and K represents Huggins' constant (assumed to be 0.343). The solution viscosity and the solvent viscosity were measured with an Ostwald viscometer. The unit is [dl/g].

(6) Void Area Percentage in Film

The film is cut in the thickness direction with a microtome, and a photograph is taken with respect to the cross section observed with a scanning electron microscope (SEM) under magnification of 500 to 50,000 times. In this cross-sectional photograph, at least 100 void portions are marked, and the resulting cross-sectional photograph is electronified by a scanner. Subsequently, an image processing measurement software "Image-ProPLUS" is used, and a proportion of the sum of void areas to the cross-sectional area in the photograph based on the observation with the microscope is calculated and expressed as a percentage.

(7) Breaking Frequency

The film breaking caused during film formation was observed and evaluated in accordance with the following criteria.

⊙: No film breaking occurred.
○: Film breaking rarely occurred.
Δ: Film breaking occurred sometimes.
×: Film breaking occurred frequently.

(8) Young's Modulus and Elongation at Break

The measurements were conducted in accordance with the following method specified in ASTM-D882, while an Instron type tensile tester (a film strength-elongation automatic measuring instrument, "Tensilon AMF/RTA-100" produced by Orienteck K. K.) was used. A sample film of 10 mm in width is pulled under the condition in which a gauge length is 100 mm and a tensile speed of 200 mm/min. The Young's modulus is determined from the slope of the tangent at the rise of the obtained tensile stress-strain curve, and the elongation at break is determined. The measurements are conducted in an atmosphere at 25° C. and 65 percent RH.

(9) Heat Shrinkage

In accordance with JIS C2318, two lines spaced 10 mm were drawn on the film surface to ensure the measuring length of about 200 mm. The distance between the two lines is accurately measured and is represented by L0. This film sample is allowed to stand with no load for 30 minutes in an oven at 100° C. or 150° C. and, thereafter, the distance between the two lines is measured again and is represented by L1. The heat shrinkage is determined based on the following formula.

heat shrinkage (percent)=$\{(L0-L1)/Lo\} \times 100$

(10) Plane Orientation Factor

The refractive index was measured with Abbe Refractometer Model 4 produced by ATAGO CO., LTD., by the use of sodium D line as a light source in accordance with the method specified in JIS K7105. The measurement was conducted at 23° C. and 65 percent RH. Subsequently, the plane orientation factor was determined from measured refractive indices based on the following formula.

plane orientation factor=$\{(nMD+nTD)/2\}-nZD$ nMD: refractive index in the film machine direction
nTD: refractive index in the film transverse direction
nZD: refractive index in the film thickness direction

(11) Storage Modulus

The storage modulus was determined in accordance with the method specified in ASTM D5026. DMS6100 produced by Seiko Instruments Inc., was used at a frequency of 1 Hz, a sample of 10 mm in width ×20 mm in length was heated from 26° C. to 240° C. at a temperature rise rate of 2° C./min, and the storage modulus at 200° C. was determined. The measurement was conducted in the film machine direction of the sample.

(12) Electromagnetic Conversion Property (C/N) of Magnetic Tape

A surface of the film is doubly coated with a magnetic coating material and non-magnetic coating material having the following respective compositions with an extrusion coater (an upper layer is the magnetic coating material having a coating thickness of 0.1 μm, and the thickness of the non-magnetic lower layer is appropriately changed), and magnetic orientation and drying are performed. Subsequently, a back coat layer having the following composition is formed on the other surface, a calendering treatment is performed with a small test calender (steel/steel rolls, 5 stages) at a temperature of 85° C. and a linear pressure: 200 kg/cm, and curing is performed at 70° C. for 48 hours. The above-described film to be used for tapes is slit into 8 mm width and, therefore, a pancake is prepared. A 200 m length of the resulting pancake is incorporated into a cassette, so that a cassette tape is prepared.

The resulting tape and a commercially available Hi8 VTR (EV-BS3000 produced by Sony Corporation) are used, and the C/N (a carrier-to-noise ratio) is measured at 7 MHz+1 MHz. The resulting C/N is compared with that of a commercially available Hi8 video tape (120 -minute MP produced by Sony Corporation). Consequently, the C/N of +3 dB or more is evaluated as ○, +1 or more and less than +3 dB is evaluated as Δ, and less than +1 dB is evaluated as ×. A tape evaluated as ○ is desirable, but even a tape evaluated as Δ can be used in practice.

| (Composition of magnetic coating material) | |
|---|---|
| ferromagnetic metal powder | 100 parts by weight |
| Na sulfonate-modified vinyl chloride copolymer | 10 parts by weight |
| Na sulfonate-modified polyurethane | 10 parts by weight |
| polyisocyanate | 5 parts by weight |
| stearic acid | 1.5 parts by weight |
| oleic acid | 1 part by weight |
| carbon black | 1 part by weight |
| alumina | 10 parts by weight |
| methyl ethyl ketone | 75 parts by weight |
| cyclohexanone | 75 parts by weight |
| toluene | 75 parts by weight |

| (Composition of non-magnetic lower layer coating material) | |
|---|---|
| titanium oxide | 100 parts by weight |
| carbon black | 10 parts by weight |
| Na sulfonate-modified vinyl chloride copolymer | 10 parts by weight |
| Na sulfonate-modified polyurethane | 10 parts by weight |
| methyl ethyl ketone | 30 parts by weight |
| methyl isobutyl ketone | 30 parts by weight |
| toluene | 30 parts by weight |

| (Composition of back coat) | |
|---|---|
| carbon black (average particle diameter 20 nm) | 95 parts by weight |
| carbon black (average particle diameter 280 nm) | 10 parts by weight |
| α alumina | 0.1 parts by weight |
| zinc oxide | 0.3 parts by weight |
| Na sulfonate-modified polyurethane | 20 parts by weight |
| Na sulfonate-modified vinyl chloride copolymer | 30 parts by weight |
| cyclohexanone | 200 parts by weight |
| methyl ethyl ketone | 300 parts by weight |
| toluene | 100 parts by weight |

(13) High-speed Abrasion Resistance

A film is slit into the shape of a tape of ½ inch in width, and the resulting film is run on a guide pin (surface roughness: 100 nm in terms of Ra) by the use of a tape runnability tester (running speed 250 m/min, the number of run 1 pass, running time 5 minutes, wrap angle: 60°, running tension: 90 g). At this time, after the running of the film is completed, the guide pin is visually observed, and when adhesion of white powder is not observed, the film is evaluated as ○, when adhesion of some white power is observed, the film is evaluated as Δ, and when adhesion of much white powder is observed, the film is evaluated as ×. A film evaluated as ○ is desirable, but even a film evaluated as Δ can be used in practice.

(14) Running Durability and Storage Property of Magnetic Tape

A surface of the film is coated with a magnetic coating material having the following composition in order that the coating thickness becomes 2.0 μm, and magnetic orientation and drying are performed. Subsequently, a back coat layer having the following composition is formed on the other surface, a calendering treatment is performed, and curing is performed at 70° C. for 48 hours. The above-described film to be used for tapes is slit into ½ inch width, a 670 m length of the film is incorporated as a magnetic tape into a cassette, so that a cassette tape is prepared.

| (Composition of magnetic coating material) | |
| --- | --- |
| ferromagnetic metal powder | 100 parts by weight |
| modified vinyl chloride copolymer | 10 parts by weight |
| modified polyurethane | 10 parts by weight |
| polyisocyanate | 5 parts by weight |
| stearic acid | 1.5 parts by weight |
| oleic acid | 1 part by weight |
| carbon black | 1 part by weight |
| alumina | 10 parts by weight |
| methyl ethyl ketone | 75 parts by weight |
| cyclohexanone | 75 parts by weight |
| toluene | 75 parts by weight |

| (Composition of back coat) | |
| --- | --- |
| carbon black (average particle diameter 20 nm) | 95 parts by weight |
| carbon black (average particle diameter 280 nm) | 10 parts by weight |
| α alumina | 0.1 parts by weight |
| modified polyurethane | 20 parts by weight |
| modified vinyl chloride copolymer | 30 parts by weight |
| cyclohexanone | 200 parts by weight |
| methyl ethyl ketone | 300 parts by weight |
| toluene | 100 parts by weight |

The resulting cassette tape is run for 100 hours by the use of Magstar3590 MODEL B1A Tape Drive produced by IBM, and the running durability of the tape is evaluated in accordance with the following criteria. A tape evaluated as ○ is acceptable.

○: Elongation and bend of the tape end face are not observed, nor is any trace of abrasion observed.

Δ: Elongation and bend of the tape end face are not observed, but some traces of abrasion are observed.

×: A part of the tape end face is elongated, seaweed-shaped deformation is observed, and traces of abrasion are observed.

The cassette tape prepared as described above is set in Magstar3590 MODEL B1A Tape Drive produced by IBM, and data is read. The resulting cassette tape is stored for 100 hours in an atmosphere at 60° C. and 80 percent RH and, thereafter, the data is reproduced. The storage property of the tape is evaluated in accordance with the following criteria. A tape evaluated as ○ is acceptable.

○: The data is reproduced without any track shift.

Δ: The tape width is normal, but a part of data cannot be read.

×: The tape width is changed, and the date cannot be read.

(15) Dimensional Stability as Circuit Material

A film side of the copper-clad polyimide film described in JIS C6472 and the film of the present invention are bonded together by an adhesive composed of a general-purpose vinyl chloride-based resin and a plasticizer, and are pressure-bonded by the use of rolls under the condition in which the temperature is 165° C., the pressure is 30 kg/cm², and the time is 30 minutes. A sample is allowed to have the dimension of 25 cm×25 cm, and the curling states of four corners are observed while the sample is put on a surface plate. An average value of amounts (mm) of warp of the four corners is determined, and the sample is evaluated in accordance with the following criteria. A sample evaluated as ⊙ or ○ is acceptable.

⊙: The amount of warp is less than 5 mm.

○: The amount of warp is 5 mm or more and less than 10 mm.

×: The amount of warp is 10 mm or more.

(16) Evaluation of Properties for Capacitor

A. Insulation Resistance

A pair of bilaterally symmetric aluminum-deposited films having a width of 30 mm and a 1.5-mm-wide margin are overlaid and wound to a length required for providing a capacity of 1.5 μF. The resulting winding is pressed at 140° C. at a pressure of 70 kg/cm² for 10 minutes so as to be molded. Metallikon is thermally sprayed on both end faces to form electrodes, and lead wires are attached, so that a capacitor sample is prepared. Subsequently, insulation resistances, in terms of 1-minute value, of 1,000 units of the resulting 1.5 μF capacitor samples are measured in an atmosphere at 23° C. and 65 percent RH with super-insulation resistance tester 4329A produced by YHP at an applied voltage of 500 V. Capacitor samples exhibiting an insulation resistance of less than 5,000 MΩ are taken as defective samples, and the capacitor is evaluated in accordance with the following criteria. A capacitor evaluated as ⊙, ○, or Δ is acceptable.

⊙: The number of defective samples is less than 10.

○: The number of defective samples is 10 or more and less than 20.

Δ: The number of defective samples is 20 or more and less than 50.

×: The number of defective samples is 50 or more.

B. Dielectric Breakdown Voltage

Evaluation is performed, as described below, in accordance with the method described in JIS-C-2318, while a non-metallized film is used as a specimen.

A rubber sheet having a rubber Shore hardness of about 60 degrees and a thickness of about 2 mm is laid on a properly sized metal flat sheet. Ten thicknesses of aluminum foils of about 6 μm in thickness each are overlaid thereon, so as to prepare a bottom electrode. A brass cylinder having a weight of about 50 g, roundness of about 1 mm around it, a diameter of 8 mm, and a smooth, flawless bottom is used as a top electrode.

Tests are performed under the following two conditions and, thereby, dielectric breakdown voltages are measured at room temperature and a high temperature. After standing for at least 48 hours in each atmosphere is performed, a specimen is held between the top electrode and the bottom electrode. In each atmosphere, a direct current voltage is applied between the two electrodes from a direct current power source, and the direct current voltage is increased at a rate of 100 V per second from 0 V until dielectric breakdown occurs. The test is performed with respect to 50 samples. Each dielectric breakdown voltage is divided by the thickness of the specimen, and average value of 50 samples is determined. The specimen is evaluated to be acceptable (○) when the average value is at least 400 V/μm under the condition 1, and when the average value is at least 350 V/μm under the condition 2.

condition 1: temperature 20° C.±5° C., relative humidity 65±5 percent condition 2: temperature 125° C.±5° C., relative humidity 65±5 percent

(17) Printability of Thermal Transfer Ribbon

A surface, which is opposite to a fusion preventive layer, of the biaxially oriented film of the present invention is coated with a thermal transfer ink having the following composition by a hot melt coater in order to have a coating thickness of 3.5 μm, so that a thermal transfer ribbon is prepared.

| (Composition of thermal transfer ink) | |
| --- | --- |
| carnauba wax | 60.6 percent by weight |
| microcrystalline wax | 18.2 percent by weight |
| vinyl acetate ethylene capolymer | 0.1 percent by weight |
| carbon black | 21.1 percent by weight |

Black solid is printed on the resulting thermal transfer ribbon with a bar code printer (BC-8) produced by Oaks, and the printability is evaluated. A ribbon evaluated as ○ is acceptable.

○: Printing is clear.

Δ: Printing shifts in pitch.

×: The ribbon is wrinkled and printing is disordered.

××: The film is wrinkled during hot melt coating, and the thermal transfer ink cannot be applied uniformly.

(18) Suitability as Antenna Substrate Used for IC Card

Twenty grams of silver powder having an average particle diameter of 5 μm and an oblateness of 10 and a butyl carbitol solution (resin concentration 33 percent) of 6.7 g of phenoxy resin (trademark UCAR PKHC, produced by Union Carbide) were put into a mortar and were mixed. Butyl carbitol was added appropriately in order that the viscosity became 100,000 centipoise at a shear rate of 240 mm per minute on a Brookfield type viscometer basis, so that a conductive paste used for printed antenna circuit was prepared.

The resulting paste was printed in the shape of a coil (20 turns, length 280 cm, design value of circuit width 400 μm, design value of circuit space 250 μm) on the film (thickness 100 μm, width 54 mm, length 86 mm, both surfaces were subjected to a corona discharge treatment) of the present invention by the use of a screen printer. Subsequently, preliminary drying was temporally performed at 100° C., and main drying was performed at 150° C., so that a printed board provided with a printed antenna circuit was prepared.

Thereafter, a chip (IC, capacitor) of 250 μm in thickness was further connected to the printed antenna circuit at 200° C. and 60 kg/cm² by the use of an anisotropic conductive film (AC-8301 produced by Hitachi Chemical Company, Ltd.), so that a printed board provided with the chip and the printed antenna circuit was prepared.

The connection portion of the circuit and the chip of the thus prepared printed board was observed, and was evaluated in accordance with the following criteria.

○: No collapse nor break of the circuit was observed around the IC.

Δ: Deformation and slight collapse of the circuit were observed around the IC.

×: The circuit around the IC was collapsed and broken.

EXAMPLES

The films will be described with respect to examples.

Example 1

Polyethylene terephthalate used as a polyester resin was prepared by adding 0.1 parts by weight of magnesium acetate tetrahydrate to 194 parts by weight of dimethyl terephthalate and 124 parts by weight of ethylene glycol and effecting transesterification at 140° C. to 230° C. while methanol was allowed to distill. An ethylene glycol solution of 0.05 parts by weight of trimethyl phosphate and 0.05 parts by weight of antimony trioxide were added, and agitation was performed for 5 minutes. The temperature of the reaction system was gradually raised from 230° C. to 290° C. and the pressure is decreased to 0.1 kPa, while the resulting oligomer was agitated at 30 rpm. Both times required to reach the final temperature and the final pressure were controlled at 60 minutes. When the polymerization reaction was effected for 3 hours and the agitation torque became a predetermined level, the reaction system was purged with nitrogen, the pressure was returned to normal pressure, and the polycondensation reaction was terminated. The resulting product was discharged into cold water to take the shape of a strand, and was immediately cut so as to prepare polyethylene terephthalate pellets having an inherent viscosity of 0.68. Cupric oxide having an average primary particle diameter (R1) of 30 nm was used as transition metal oxide particles, 1 part by weight of cupric oxide was blended in 99 parts by weight of PET, and the resulting mixture was fed into a vent type twin screw kneading extruder heated to 295° C. Melt extrusion was performed with a residence time of 30 seconds and, thereby, polymer chips (polymer A) containing 1 percent by weight of cupric oxide particles were prepared.

The resulting polymer A was extruded with a melt extruder at 280° C. The polymer A from a nozzle was brought into intimate contact with a casting drum having a surface temperature of 25° C. while a static charge was applied, so as to be cooled and solidified and, thereby, an unstretched film was prepared.

The resulting unstretched film was stretched 3.3 times in a machine direction with a roll stretching machine at a stretching temperature of 95° C. and, thereafter, a heat treatment was performed at 150° C. for 0.5 seconds under a tension in a tenter preheating zone. Subsequently, the film was stretched 3.6 times in a transverse direction with a tenter at a temperature of 95° C. Furthermore, the resulting film was re-stretched 1.7 times in the machine direction with the roll stretching machine at a stretching temperature of 135° C., and was further re-stretched 1.3 times in the transverse direction with the tenter at a stretching temperature of 190° C. The film was heat-treated at an atmospheric temperature of 210° C. for 2 seconds while the length was kept constant, and was treated at 150° C. for 1 second in a cooling zone while relaxing of 3 percent was performed. Thereafter, the film was gradually cooled at 100° C. for 3 seconds while relaxing of 2 percent was performed, so that a biaxially oriented polyester film having a thickness of 6 μm and a film IV of 0.60 was prepared.

The properties of the resulting biaxially oriented polyester film are as shown in Table 1, and excellent heat resistance, thermal dimensional stability, and mechanical properties were exhibited.

Example 2

Glass beads (50 μm) were mixed with the same volume of water, cupric oxide particles were added, and agitation and dispersion (agitation speed: 3,000 rpm, agitation time: 4 hours) were performed. After the agitation was completed, glass beads were removed and, thereby, a water slurry of cupric oxide particles was prepared. The resulting slurry was filtrated with a 1 μm cut filter so as to remove coarse particles. The concentration of the water slurry of cupric oxide particles was measured, and was 4 percent by weight. The resulting slurry was added to the vent type twin screw kneading extruder having an L/D=30 while the extruder was heated to 295° C. in order that 99 percent by weight of PET, prepared as in Example 1, and 1 percent by weight of cupric oxide were included. Melt extrusion was performed with a residence time of 30 seconds and, thereby, polymer chips (polymer B) containing 1 percent by weight of cupric oxide were prepared. The resulting polymer B was extruded at 280° C. with a polymer discharge time of 3 minutes by the use of a melt extruder having a shear velocity of 200 sec$^{-1}$ and an L/D=28. The polymer B from a nozzle was brought into intimate contact with a casting drum having a surface temperature of 25° C. while a static charge was applied, so as to be cooled and solidified and, thereby, an unstretched film was prepared. Subsequently, stretching was performed as in Example 1 and, thereby, a biaxially oriented polyester film having a thickness of 6 μm and a film IV of 0.62 was prepared.

The properties of the resulting biaxially oriented polyester film are as shown in Table 1. The dispersibility of cupric oxide particles present in the film was excellent compared with that in Example 1, and excellent heat resistance, thermal dimensional stability, and mechanical properties were exhibited.

Example 3

A film was prepared as in Example 2 except that lithium dodecylbenzenesulfonate was added as a surface treatment agent of cupric oxide particles in Example 2. The resulting film had a thickness of 6 μm and a film IV of 0.65, as is shown in Table 1, the dispersibility of cupric oxide particles present in the film was further excellent compared with that in Example 2, and excellent heat resistance, thermal dimensional stability, and mechanical properties were exhibited.

Example 4

A film having a thickness of 6 μm and a film IV of 0.58 was prepared as in Example 1 except that the amount of addition of cupric oxide particles was changed to 5 percent by weight. Although the amount of addition of particles was 5 percent by weight, the resulting film had the effect of improving the heat resistance, the thermal dimensional stability, and the mechanical properties equivalent to that in Example 1.

Example 5

An unstretched film was prepared as in Example 1 except that the polyester resin was changed to polyethylene naphthalate (hereafter referred to as PEN), which was prepared by a usual method and had an IV of 0.68, and the temperature of melt extrusion was changed to 300° C.

The resulting unstretched film was stretched 4.0 times in a machine direction with a roll stretching machine at a stretching temperature of 135° C. and, thereafter, a heat treatment was performed at 170° C. for 0.5 seconds under a tension in a tenter preheating zone. Subsequently, the film was stretched 4.0 times in a transverse direction with a tenter at a temperature of 140° C. Furthermore, the resulting film was re-stretched 1.55 times in the machine direction with the roll stretching machine at a stretching temperature of 170° C., and was further re-stretched 1.2 times in the transverse direction with the tenter at a stretching temperature of 210° C. The film was heat-treated at an atmospheric temperature of 230° C. for 2 seconds while the length was kept constant. The film was gradually cooled at 150° C. for 1 second in a cooling zone with a relaxing rate of 5 percent, and was gradually cooled at 100° C. for 3 seconds. Stretching and heat treatments other than that described above were performed as in Example 1 and, thereby, a biaxially oriented film having a thickness of 6 μm and a film IV of 0.63 was prepared.

Example 6

A film having a thickness of 6 μm and a film IV of 0.59 was prepared as in Example 1 except that yellow iron oxide having an average primary particle diameter of 40 nm was used.

TABLE 1

| | | | Unit | Example 1 | Example 2 | Example 3 | Example 4 | Example 5 | Example 6 |
|---|---|---|---|---|---|---|---|---|---|
| Film component | Polyester resin | | | PET | PET | PET | PET | PEN | PET |
| | Particle | Primary component | | Copper oxide (II) | Copper oxide (II) | Copper oxide (II) | Copper oxide (II) | Copper oxide (II) | Yellow iron oxide |
| | | Average primary particle diameter | nm | 30 | 30 | 30 | 30 | 30 | 40 |
| | | Average secondary particle diameter | nm | 170 | 65 | 60 | 230 | 170 | 180 |
| | | Content | % by weight | 1 | 1 | 1 | 5 | 1 | 1 |

TABLE 1-continued

| | | | Unit | Example 1 | Example 2 | Example 3 | Example 4 | Example 5 | Example 6 |
|---|---|---|---|---|---|---|---|---|---|
| Film formation | Total stretching ratio | MD | times | 5.6 | 5.6 | 5.6 | 5.6 | 6.2 | 5.6 |
| | | TD | times | 4.6 | 4.6 | 4.6 | 4.6 | 4.8 | 4.6 |
| | Heat treatment | | | Performed | Performed | Performed | Performed | Performed | Performed |
| | Breaking | | | ○ | ⊚ | ⊚ | ○-Δ | ○ | ○ |
| Film property | Film melting point | | °C. | 258 | 263 | 264 | 258 | 269 | 258 |
| | Resin melting point | | °C. | 255 | 255 | 255 | 255 | 265 | 255 |
| | Void area percentage | | % | 1 | 1 | 1 | 1 | 1 | 1 |
| | Plane orientation factor | | | 0.178 | 0.181 | 0.181 | 0.180 | 0.275 | 0.180 |
| | Coarse aggregate | | | ○ | ⊚ | ⊚ | ○ | ○ | ○ |
| | Young's modulus | MD | GPa | 7.5 | 8.4 | 8.5 | 8.0 | 9.5 | 7.5 |
| | | TD | GPa | 7.0 | 7.3 | 7.5 | 7.0 | 7.5 | 6.5 |
| | Elongation at break | MD | % | 45 | 50 | 50 | 30 | 60 | 50 |
| | | TD | % | 120 | 130 | 130 | 100 | 120 | 80 |
| | Heat shrinkage 100° C. | MD | % | 1.0 | 0.3 | 0.2 | 1.0 | 0.2 | 1.0 |
| | | TD | % | 0.0 | 0.0 | 0.0 | 0.0 | 0.0 | 0.0 |
| | Heat shrinkage 150° C. | MD | % | 1.5 | 0.5 | 0.3 | 1.5 | 0.5 | 1.5 |
| | | TD | % | 0.2 | 0.1 | 0.0 | 0.3 | 0.0 | 0.5 |
| | Storage modulus | MD | GPa | 0.5 | 1.1 | 1.2 | 0.6 | 0.5 | 0.4 |

Notes)
MD: Film machine direction,
TD: Film transverse direction
Average particle diameter R of particles: Average particle diameter of particles in a film Example 7

Polymer chips were prepared as in Example 2 except that a linear PPS resin (Ryton T1881) produced by Toray Industries, Ltd., was used and 0.12 percent by weight of SYLOID 300 and 0.05 percent by weight of calcium stearate were used as additives. The resulting mixture was fed into a melt extruder similar to that in Example 2, and was melted at 310° C. The melted mixture was passed through a filter box to cut foreign matters of at least 10 μm, and was extruded into the shape of a film from a T die nozzle having a lip width of 1,200 mm and a lip spacing of 1.5 mm. The thus extruded melted film was applied with a static charge, and was brought into intimate contact with a casting drum (diameter 800 mm) having a surface temperature of 25° C., so as to be cooled and solidified. The resulting film was fed into a longitudinal stretching machine composed of a plurality of heating rolls, and was stretched 3.5 times at a film temperature of 100° C. Subsequently, the film was stretched 4.0 times in a transverse direction with a tenter at 100° C., and was heat-treated at 230° C. for 5 seconds so as to be relaxed by 8 percent in the tenter transverse direction. End edges were cut and, thereby, a biaxially oriented PPS film having a thickness of 6 μm was prepared.

As shown in Table 2, the resulting biaxially oriented PPS film had excellent particle dispersion property, and excellent heat resistance, thermal dimensional stability, and mechanical properties were exhibited.

Example 8

A film was prepared as in Example 1 except that no heat treatment was performed in the tenter preheating zone after the stretching was performed in the machine direction. With respect to the resulting biaxially oriented polyester film, voids were increased and, thereby, the stability of the film formation was reduced. In addition, the mechanical properties were lowered compared with those in Example 1.

Example 9

A film was prepared as in Example 5 except that no heat treatment was performed in the tenter preheating zone after the stretching was performed in the machine direction. With respect to the resulting biaxially oriented polyester film, voids were increased and, thereby, the stability of the film formation was reduced. In addition, the mechanical properties were lowered compared with those in Example 1.

Example 10

A film of 6 μm in thickness was prepared as in Example 1 except that after an unstretched film was prepared as in Example 2, the stretching ratio in the machine direction was changed to 3.5 times, the stretching ratio in the transverse direction was changed to 4.5 times and, thereafter, no re-stretching in the machine direction and the transverse direction was performed. The resulting biaxially oriented polyester film had excellent particle dispersion property, and excellent heat resistance, mechanical properties, and thermal dimensional stability were exhibited.

Comparative Example 1

A film having a thickness of 6 μm and a film IV of 0.65 was prepared as in Example 1 except that no copper oxide particle was contained.

Comparative Example 2

A film having a thickness of 6 μm and a film IV of 0.65 was prepared as in Example 5 except that no copper oxide particle was blended.

TABLE 2

| | | | Unit | Example 7 | Example 8 | Example 9 | Example 10 | Comparative example 1 | Comparative example 2 |
|---|---|---|---|---|---|---|---|---|---|
| Film component | Polyester resin | | | PPS | PET | PEN | PET | PET | PEN |
| | Particle | Primary component | | Copper oxide (II) | Copper oxide (II) | Copper oxide (II) | Copper oxide (II) | — | — |
| | | Average primary particle diameter | nm | 30 | 30 | 30 | 30 | — | — |
| | | Average secondary particle diameter | nm | 70 | 170 | 170 | 70 | — | — |
| | | Content | weight | 1 | 1 | 1 | 1 | — | — |
| Film formation | Total stretching ratio | MD | times | 3.5 | 5.6 | 6.2 | 3.5 | 5.6 | 6.2 |
| | | TD | times | 4.0 | 4.6 | 4.8 | 4.5 | 4.6 | 4.8 |
| | Heat treatment | | | Performed | None | None | Performed | Performed | Performed |
| | Breaking | | | ◎ | Δ | Δ | ◎ | ◎ | ◎ |
| Film property | Film melting point | | °C. | 290 | 258 | 269 | 258 | 255 | 265 |
| | Resin melting point | | °C. | 276 | 255 | 265 | 255 | 255 | 265 |
| | Void area percentage | | % | 1 | 5 | 5 | 1 | — | — |
| | Plane orientation factor | | | — | 0.178 | 0.250 | 0.169 | 0.175 | 0.260 |
| | Coarse aggregate | | | ◎ | ○ | ○ | ○ | — | — |
| | Young's modulus | MD | GPa | 4.5 | 7.0 | 8.5 | 5.0 | 7.0 | 8.5 |
| | | TD | GPa | 5.3 | 6.5 | 7.0 | 6.5 | 4.5 | 6.5 |
| | Elongation at break | MD | % | 90 | 65 | 60 | 120 | 60 | 50 |
| | | TD | % | 70 | 70 | 70 | 95 | 100 | 100 |
| | Heat shrinkage 100° C. | MD | % | 0.5 | 1.3 | 0.5 | 0.5 | 1.0 | 0.2 |
| | | TD | % | 0.0 | 0.0 | 0.0 | 0.3 | 0.0 | 0.0 |
| | Heat shrinkage 150° C. | MD | % | 0.8 | 1.8 | 0.8 | 0.9 | 3.5 | 2.0 |
| | | TD | % | 0.3 | 0.0 | 0.0 | 0.5 | 1.5 | 0.5 |
| | Storage modulus | MD | GPa | 0.7 | 0.5 | 0.4 | 0.4 | 0.3 | 0.4 |

Notes)
MD: Film machine direction,
TD: Film transverse direction
Average particle diameter R of particles: Average particle diameter of particles in a film Comparative Example 3

A film having a thickness of 6 µm and a film IV of 0.60 was prepared as in Example 1 except that cupric oxide particles having an average primary particle diameter of 200 nm were used.

Comparative Example 4

A film having a thickness of 6 µm was prepared as in Example 7 except that no cupric oxide particle was blended.

Comparative Example 5

A film having a thickness of 6 µm and a film IV of 0.60 was prepared as in Example 10 except that no cupric oxide particle was blended.

Comparative Example 6

A film having a thickness of 6 µm and a film IV of 0.58 was prepared as in Example 1 while alumina particles having an average primary particle diameter of 50 nm were used as the particles. With respect to the resulting biaxially oriented polyester film, alumina particles were present as aggregates in the film and, thereby, the stability of film formation was poor, the Young's modulus was low, the void area percentage was large, and the elongation at break was small compared with those in Example 1.

Comparative Example 7

A film having a thickness of 6 µm and a film IV of 0.55 was prepared as in Example 1 except that 10 percent by weight of cupric oxide particles used in Example 1 were blended. With respect to the resulting biaxially oriented polyester film, particles were present as aggregates in the film and, thereby, the stability of film formation was poor, the Young's modulus was low, the void area percentage was large, and the elongation at break was small compared with those in Example 1. Furthermore, the thermal dimensional stability was also poor.

TABLE 3

| | | | Unit | Comparative example 3 | Comparative example 4 | Comparative example 5 | Comparative example 6 | Comparative example 7 |
|---|---|---|---|---|---|---|---|---|
| Film component | Polyester resin | | | PET | PPS | PET | PET | PET |
| | Particle | Primary component | | Copper oxide (II) | — | — | Alumina | Copper oxide (II) |
| | | Average primary particle diameter | nm | 200 | — | — | 50 | 50 |
| | | Average secondary particle diameter | nm | 1000 | — | — | 500 | 1350 |
| | | Content | % by weight | 1 | — | — | 1 | 10 |
| Film formation | Total stretching ratio | MD | times | 5.6 | 3.5 | 3.5 | 5.6 | 5.6 |
| | | TD | times | 4.6 | 4.0 | 4.5 | 4.6 | 4.6 |
| | Heat treatment | | | Performed | Performed | Performed | Performed | Performed |
| | Breaking | | | Δ-X | ○ | ⊚ | X | X |
| Film property | Film melting point | | °C. | 255 | 276 | 255 | 255 | 255 |
| | Resin melting point | | °C. | 255 | 276 | 255 | 255 | 255 |
| | Void area percentage | | % | 2 | — | — | 15 | 20 |
| | Plane orientation factor | | | 0.175 | — | 0.165 | 0.175 | 0.170 |
| | Coarse aggregate | | | X | — | — | X | X |
| | Young's modulus | MD | GPa | 7.0 | 4.0 | 4.5 | 7.0 | 7.0 |
| | | TD | GPa | 5.5 | 4.2 | 6.0 | 4.5 | 4.2 |
| | Elongation at break | MD | % | 40 | 60 | 120 | 35 | 40 |
| | | TD | % | 60 | 50 | 90 | 55 | 50 |
| | Heat shrinkage 100° C. | MD | % | 1.2 | 2.0 | 1.2 | 1.7 | 2.0 |
| | | TD | % | 0.0 | 1.0 | 1.0 | 0.0 | 0.8 |
| | Heat shrinkage 150° C. | MD | % | 3.0 | 4.0 | 3.0 | 2.5 | 5.0 |
| | | TD | % | 1.0 | 2.0 | 1.0 | 0.5 | 2.0 |
| | Storage modulus | MD | GPa | 0.4 | 0.3 | 0.3 | 0.3 | 0.3 |

Notes)
MD: Film machine direction,
TD: Film transverse direction
Average particle diameter R of particles: Average particle diameter of particles in a film

Example 11

Polymer chips (I) containing 1 percent by weight of cupric oxide particles were prepared in a manner similar to that in Example 2 except that 0.40 percent by weight of spherical silica particles having an average particle diameter of 0.07 μm were blended. Furthermore, polymer chips (II) containing 1 percent by weight of cupric oxide particles were prepared in a manner similar to that in Example 2 except that 0.5 percent by weight of spherical cross-linked polystyrene particles having an average particle diameter of 0.3 μm and 0.025 percent by weight of spherical cross-linked polystyrene particles having an average particle diameter of 0.8 μm were blended.

Two extruders A and B were used, and a laminated film was formed while the extruder A formed a magnetic surface and the extruder B formed a running surface. The polymer chips (I) were dried at 180° C. for 3 hours under a reduced pressure and, thereafter, were fed into the extruder A heated to 280° C. On the other hand, the polymer chips (II) were dried at 180° C. for 3 hours under a reduced pressure and, thereafter, were fed into the extruder B heated to 280° C. as well. The polymers were passed through respective fiber-sintered stainless metal filters (5 μm cut) and, thereafter, were joined in a T die (lamination ratio I/II=10/1). The resulting mixture was brought into intimate contact with a casting drum having a surface temperature of 25° C. through static electricity, so as to be cooled and solidified and, thereby, an unstretched laminated film was prepared.

Subsequently, the thus prepared film was stretched as in Example 2 and, thereby, a biaxially oriented polyester film having a thickness of 6.0 μm was prepared.

The magnetic tape properties of the resulting film are shown in Table 4. The film containing cupric oxide of the present invention had excellent strength and thermal dimensional stability, and had significantly excellent magnetic tape properties, e.g., the running durability, the storage stability, and the high-speed abrasion resistance, compared with those of the film composed of PET along in Comparative example 8.

Comparative Example 8

A film was prepared as in Example 11 except that no cupric oxide was blended. As is shown in Table 4, the resulting biaxially oriented polyester film had poor strength, thermal dimensional stability, and magnetic tape properties, e.g., the running durability, the storage stability, the high-speed abrasion resistance, and the electromagnetic conversion property, compared with those in Example 11.

TABLE 4

|  | High-speed abrasion resistance | Electromagnetic conversion property | Running durability | Storage stability |
|---|---|---|---|---|
| Example 11 | ○ | ○ | ○ | ○ |
| Comparative example 8 | X | Δ | X | X |

Example 12

A biaxially oriented film having a thickness of 100 μm was prepared in a manner similar to that in Example 10. The thickness was adjusted by controlling the amount of discharge of the extruder. With respect to the resulting film, practical properties for circuit materials were evaluated by the above-described methods. As is shown in Table 5, the resulting film had very excellent properties for film circuit materials compared with those of the film composed of PET along in Comparative example 9.

Comparative Example 9

A film was prepared as in Example 12 except that no cupric oxide was blended. With respect to the resulting film, practical properties for circuit materials were evaluated by the methods as in Example 12. As is shown in Table 5, the resulting film exhibited warp larger than that of the film in Example 12 and, thereby, had poor properties for circuit materials.

TABLE 5

|  | Warp |
|---|---|
| Example 12 | ⊚ |
| Comparative example 9 | X |

Example 13

A biaxially oriented film having a thickness of 3.5 μm was prepared in a manner similar to that in Example 10. The thickness was adjusted by controlling the amount of discharge of the extruder. With respect to the resulting film, practical properties for capacitors were evaluated. As is shown in Table 6, the film of the present Example had very excellent properties for capacitors compared with those of the film composed of PET along in Comparative example 10.

Comparative Example 10

A film was prepared as in Example 13 except that no cupric oxide was blended. With respect to the resulting film, practical properties for capacitors were evaluated. As is shown in Table 6, the resulting film exhibited poor heat resistance compared with that of the film in Example 13.

TABLE 6

|  | Dielectric breakdown voltage | |
|---|---|---|
|  | 20° C., 65% RH | 125° C., 65% RH |
| Example 13 | ○ | ○ |
| Comparative example 10 | X | X |

Example 14

Polymer chips containing cupric oxide were prepared as in Example 2 except that 0.25 percent by weight of aggregated silica particles having an average particle diameter of 0.3 μm were blended in PET prepared in Example 2. The resulting polymer chips were applied to one surface of the unstretched film prepared as in Example 2, and a coating agent having the following composition was applied as a fusion preventive layer by a gravure coater in order to have a coating thickness of 0.5 μm after drying.

| (Composition of coating agent) | |
|---|---|
| acrylic ester | 14.0 percent by weight |
| amino-modified silicone | 5.9 percent by weight |
| isocyanate | 0.1 percent by weight |
| water | 80.0 percent by weight |

Subsequently, stretching was performed as in Example 10, so that a biaxially oriented polyester film having a thickness of 3.5 μm was prepared. The resulting film was processed, and practical properties for thermal transfer ribbons were evaluated. As is shown in Table 7, the resulting film has very excellent properties for thermal transfer ribbons compared with those of the film composed of PET along in Comparative example 11.

Comparative Example 11

A film was prepared as in Example 14 except that no cupric oxide was blended. With respect to the resulting film, practical properties for thermal transfer ribbons were evaluated. As is shown in Table 7, the film composed of PET along of the present Comparative example tended to be wrinkled during printing and, therefore, was unable to be used as thermal transfer ribbons.

TABLE 7

|  | Printability |
|---|---|
| Example 14 | ○ |
| Comparative example 11 | X |

Example 15

An example will be described in which an IC card was prepared by the use of the film in Example 10.

Biaxially oriented films having thicknesses of 50 μm and 100 μm were prepared in a manner similar to that in Example 10. The thickness was adjusted by controlling the amount of discharge of the extruder.

The thus prepared films having thicknesses of 50 μm and 100 μm were cut to a card size (width 54 mm, length 86 mm). The biaxially oriented film having a thickness of 50 μm was used, and a printed board provided with a chip and a printed antenna circuit was formed in accordance with the above description.

On the other hand, another biaxially oriented film (width 54 mm, length 86 mm) having a thickness of 50 μm was used, and was provided with an opening having a size larger than the chip-forming portion of the above-described printed board by 100 μm in each of the width direction and the length direction, so that a film A was formed. Consequently, the chip was exposed when the above-described printed board was overlaid with the film A.

After both surfaces of the resulting film A were subjected to a corona discharge treatment, an adhesive of 25 μm was formed, and the above-described printed board was overlaid with the film A in order that the chip was exposed. Two card-shaped films B having a thickness of 100 μm were prepared, in which both surfaces were subjected to a corona discharge treatment, and adhesives of 25 μm were formed. The films B were overlaid on the top and bottom of the printed board bonded together with the film A. Subsequently, the resulting multilayer laminate was laminated with a laminator having a roll temperature of 120° C., so that an IC card having a thickness of about 520 μm was prepared. The thus prepared card was not curled, exhibited excellent flatness, and had an excellent appearance as a card. The antenna substrate in the inside of the card was not deformed at all. No collapse of the chip nor break of the connection portion between the chip and the circuit was observed. The results are shown in Table 8.

Comparative Example 12

A film was prepared as in Example 15 except that no cupric oxide was blended. Subsequently, an IC card was prepared as in Example 15. The resulting card was significantly curled, exhibited poor flatness, and had a poor appearance as a card. Deformation of the antenna substrate in the inside of the card was observed, and break of the connection portion between the chip and the circuit occurred. The results are shown in Table 8.

TABLE 8

| | IC card antenna substrate |
|---|---|
| Example 15 | ○ |
| Comparative example 12 | X |

INDUSTRIAL APPLICABILITY

A biaxially oriented thermoplastic resin film having excellent heat resistance, thermal dimensional stability, and mechanical properties can be provided. Therefore, the biaxially oriented thermoplastic resin film can be widely used as films for various industrial materials, for example, magnetic recording media, circuit materials, capacitors, thermal transfer ribbons, and cards.

The invention claimed is:

1. A biaxially oriented thermoplastic resin film comprising a thermoplastic resin containing transition metal oxide particles, wherein the difference between a peak temperature (melting point $T_1$) of the heat of fusion in a first run of a measurement of the biaxially oriented thermoplastic resin film with a differential scanning calorimeter (DSC) and a peak temperature (melting point $T_2$) of the heat of fusion in a second run satisfies Formula (1):

$$2° C. \leq T_1 - T_2 \leq 30° C. \tag{1}$$

and the film has a storage modulus of the film in a dynamic viscoelasticity measurement at 200° C. of 0.4 GPa or more and less than 1.5 GPa.

2. A biaxially oriented thermoplastic resin film comprising a thermoplastic resin containing transition metal oxide particles, wherein the melting point of the biaxially oriented thermoplastic resin film is higher than the melting point of the thermoplastic resin, and the difference between a peak temperature (melting point $T_1$) of the heat of fusion in a first run of a measurement of the biaxially oriented thermoplastic resin film with a differential scanning calorimeter (DSC) and a peak temperature (melting point $T_2$) of the heat of fusion in a second run satisfies Formula (1):

$$2° C. \leq T_1 - T_2 \leq 30° C. \tag{1}$$

and the film has a storage modulus of the film in a dynamic viscoelasticity measurement at 200° C. of 0.4 GPa or more and less than 1.5 GPa.

3. The biaxially oriented thermoplastic resin film according to claim 1 or 2, wherein the thermoplastic resin is a resin primarily containing at least one selected from the group consisting of a polyester, a polyphenylene sulfide, a polyolefin, a polyamide, a polyimide, a polycarbonate, and a polyetheretherketone.

4. The biaxially oriented thermoplastic resin film according to claim 1 or 2, wherein the thermoplastic resin is a resin primarily containing a polyester.

5. The biaxially oriented thermoplastic resin film according to claim 1 or 2, wherein an average primary particle diameter of the transition metal oxide particles is 3 to 120 nm.

6. The biaxially oriented thermoplastic resin film according to claim 1 or 2, wherein an average secondary particle diameter of the transition metal oxide particles is 3 to 250 nm.

7. The biaxially oriented thermoplastic resin film according to claim 1 or 2, comprising a polyester which primarily contains ethylene naphthalate and further contains transition metal oxide particles, wherein the film has a plane orientation factor of 0.210 or more and less than 0.280.

8. The biaxially oriented thermoplastic resin film according to claim 1 or 2, comprising a polyester which primarily contains ethylene terephthalate and further contains transition metal oxide particles, wherein the film has a plane orientation factor of 0.165 to 0.200.

9. The biaxially oriented thermoplastic resin film according to claim 1 or 2, comprising 0.01 to 5 percent by weight of the transition metal oxide particles.

10. The biaxially oriented thermoplastic resin film according to claim 1 or 2, wherein a primary component constituting the transition metal oxide particle is copper oxide.

11. The biaxially oriented thermoplastic resin film according to claim 1 or 2, wherein a void area percentage in the film is 0 percent or more and 5 percent or less.

12. The biaxially oriented thermoplastic resin film according to claim 1 or 2, wherein a total of the Young's modulus in a machine direction and a transverse direction of the film is 9 GPa or more and 35 GPa or less.

13. The biaxially oriented thermoplastic resin film according to claim 1 or 2, wherein the film has a thickness of 0.5 μm or more and 300 μm or less.

14. The biaxially oriented thermoplastic resin film according to claim 1 or 2, wherein the film has a number of coarse aggregates of at least 3 μm in an amount of 30 per 100 cm$^2$ or less.

15. The biaxially oriented thermoplastic resin film according to claim 1 or 2, wherein heat shrinkage of the film at 100° C. is 0 percent or more and less than 1.0 percent.

16. The biaxially oriented thermoplastic resin film according to claim 1 or 2, wherein heat shrinkage of the film at 150° C. is 0 percent or more and less than 1.5 percent.

17. A magnetic recording medium comprising the biaxially oriented thermoplastic resin film according to claim 1 or 2.

18. A circuit material comprising the biaxially oriented thermoplastic resin film according to claim 1 or 2.

19. A capacitor comprising the biaxially oriented thermoplastic resin film according to claim 1 or 2.

20. A thermal transfer ribbon comprising the biaxially oriented thermoplastic resin film according to claim 1 or 2.

21. A card comprising the biaxially oriented thermoplastic resin film according to claim 1 or 2.

22. A biaxially oriented thermoplastic resin film comprising a thermoplastic resin containing transition metal oxide particles and a polyester which primarily contains ethylene naphthalate and the transition metal oxide particles, wherein the melting point of the biaxially oriented thermoplastic resin film is higher than the melting point of the thermoplastic resin and wherein a storage modulus of the film in a dynamic viscoelasticity measurement at 200° C. is 0.4 GPa or more and less than 1.5 GPa.

* * * * *